United States Patent [19]

Meier et al.

[11] Patent Number: 5,673,208
[45] Date of Patent: Sep. 30, 1997

[54] FOCUS SPOT DETECTION METHOD AND SYSTEM

[75] Inventors: Daniel Meier, Boise; Gregory King, Meridian; Michael McMahon, Boise, all of Id.

[73] Assignee: Micron Technology, Inc., Boise, Id.

[21] Appl. No.: 631,306

[22] Filed: Apr. 11, 1996

[51] Int. Cl.$^6$ ............... G03B 27/42; G01J 1/20
[52] U.S. Cl. ............ 364/525; 364/468.01; 364/551.01; 324/765; 355/53; 355/55; 356/141.2; 356/152.1; 356/400; 414/247; 414/935; 414/936; 414/937; 414/940; 382/141; 382/144; 382/145
[58] Field of Search .................. 364/525, 468, 364/551.01, 140, 167.01; 324/765, 512, 513; 355/43, 53, 77, 55–57, 63; 356/139.03, 139.1, 141.2, 152.1; 414/935–941, 242–245, 233, 247; 382/141, 144–145, 154

[56] References Cited

U.S. PATENT DOCUMENTS

| | | | |
|---|---|---|---|
| 4,571,685 | 2/1986 | Kamoshida | 364/468.15 |
| 4,780,617 | 10/1988 | Umatate et al. | 250/548 |
| 4,818,169 | 4/1989 | Schram | 414/331 |
| 4,908,772 | 3/1990 | Chi | 364/491 |
| 4,982,227 | 1/1991 | Suzuki | 355/53 |
| 5,070,488 | 12/1991 | Fukushima et al. | 369/44.12 |
| 5,291,239 | 3/1994 | Jackson | 355/53 |
| 5,361,122 | 11/1994 | Kataoka et al. | 355/53 |
| 5,365,051 | 11/1994 | Suzuki et al. | 250/201.2 |
| 5,422,724 | 6/1995 | Kinney et al. | 356/375 |
| 5,483,056 | 1/1996 | Imai | 250/201.4 |

*Primary Examiner*—James P. Trammell
*Assistant Examiner*—Tuan Q. Dam
*Attorney, Agent, or Firm*—Schwegman, Lundberg, Woessner & Kluth, P.A.

[57] ABSTRACT

A method and system for detecting focus spots. Data from a file created during stepper operation is extracted to get field coordinate position, leveling scheme, and tilt with respect to the x- and y-axes, and wafer height with respect to the focal plane for the multiple fields on the multiple wafers in a production batch. A delta value is calculated for the x- and y-axes tilt data which averages the tilt of each field with its surrounding fields. Delta values are placed in a 3-dimensional data structure linking neighboring fields and corresponding fields on subsequent wafers. Focus spots are detected by the repeated presence of data spikes over the sum of the arithmetic mean and some multiple of the standard deviation of the delta values.

18 Claims, 5 Drawing Sheets

FOCUS SPOT DETECTION METHOD AND SYSTEM

FIELD OF THE INVENTION

The present invention relates to the production of integrated circuits by photolithography and in particular to the inspection of the wafers manufactured by photolithographic means to detect the presence of focus spots.

BACKGROUND

Photolithography is used to produce semiconductor integrated circuits (ICs). Such a process uses photographic techniques to impart patterns for the construction of ICs on wafers. Due to the extremely small size of these intricate circuits, the manufacturing process must be excessively monitored to ensure that contaminating particles are not present. A particle may be inadvertently introduced to the process, often times becoming sandwiched between the wafer and its retaining vacuum platform. The intruding particle causes a region of the wafer to be subject to improper focusing by the photographing unit.

Improper focusing on such a wafer region causes what is known as a focus spot. Such spots are recognizable by human inspectors and are a major problem for chip makers. Focus spots can affect perhaps 4% of all batches. There is a need in the art for an automated system for focus spot detection. Such a system could inspect a batch of wafers soon after their production, thus saving the time lag experienced as human inspectors more slowly examine the wafers.

Such a system could save expense as well as time. Frequently, a surface contaminant will remain on the vacuum platform and will cause focus spots in several wafers at the same location. By detecting the appearance of a focus spot soon after the batch has been completed, engineers can be notified to clean the vacuum platform before the next batch of wafers is introduced.

The detection method must also be accurate. False focus spot detection is detrimental to the manufacturing process because such false flagging of batches will cause added work for human inspectors, and will cause unnecessary interruption of the manufacturing process for machine inspection and cleaning.

SUMMARY OF THE INVENTION

A method for detecting focus spots is described. A data file produced during the stepper operation of the manufacturing of batches of semiconductor wafers containing multiple exposure fields is utilized. Leveling schemes, field coordinate positions, wafer tilt with respect to the x- and y-axes (Rx and Ry, respectively), and wafer height with respect to the focal plane are extracted from the data file. The data is lower-bound adjusted by adjusting Rx, Ry and wafer height values which fall below the arithmetic mean of batch data and by calculating a delta value for each data element. The delta value consists of a type of average of the value with that of four neighboring values. The delta values are placed into a 3-dimensional data structure for analysis.

Focus spots are reported when the traversal of the data structure finds delta values above a flagging threshold (the sum of the arithmetic mean and some multiple of the standard deviation) for a specified number of times in the same coordinate position or for a specified number of times in general.

DETAILED DESCRIPTION

In the following Detailed Description, reference is made to the accompanying drawings which form a part hereof and in which is shown by way of illustration specific embodiments in which the invention may be practiced. These embodiments are described in sufficient detail to enable those skilled in the art to practice and to use the invention, and it is to be understood that other embodiments may be utilized and that changes may be made without departing from the spirit and scope of the present invention. The following Detailed Description is, therefore, not to be taken in a limiting sense and the scope of the invention is defined by the appended claims. In the figures, elements having the same number perform essentially the same functions.

Figure 1:
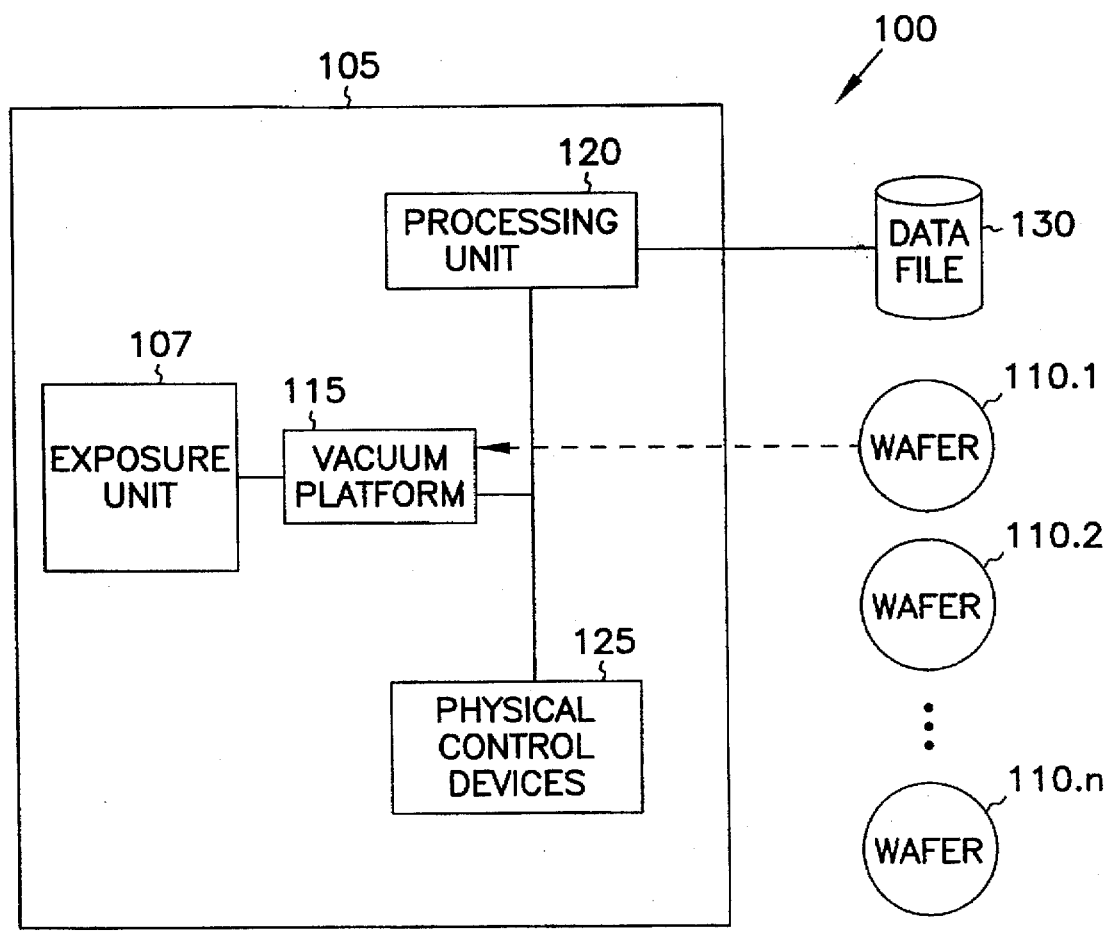
FIG. 1 is a block diagram of the photolithography process.

Focus spots can spoil wafers manufactured by photolithography. FIG. 1 is a block diagram of the photolithography process. FIG. 1 shows a photolithographic system 100 comprising a stepper machine 105 capable of working wafers 110.1 through 110.n. Stepper machine includes an exposure unit 107, vacuum platform 115, processing unit 120 and physical control devices 125. Exposure unit 107 of current technology includes an illumination source and pattern mask. Exposure unit 107 of a future technology may utilize electron beams instead to pattern the wafer directly. Vacuum platform 115 accommodates wafer 110 during the photolithographic exposure. Physical control devices 125 include actuators which adjust the wafer's height and tilt about the x- and y-axes. Processing unit 120 is programmed to control the movement of physical control devices 125. Processing unit 120 also retrieves readings from physical control devices 125 and writes such data to data file 130. Stepper machine 105 can be a PAS 5500/100 stepper available from ASM Lithography of Velthoden, Holland. Processing unit 120 can be implemented as a Sun Workstation available from Sun Microsystems of Palo Alto, Calif. Processing unit 120 can use ASM Lithography's PAS software to obtain the readings from physical control devices 125 and save such data to data file 130. Other stepper machines, processing units and software can also be used.

Figure 2:
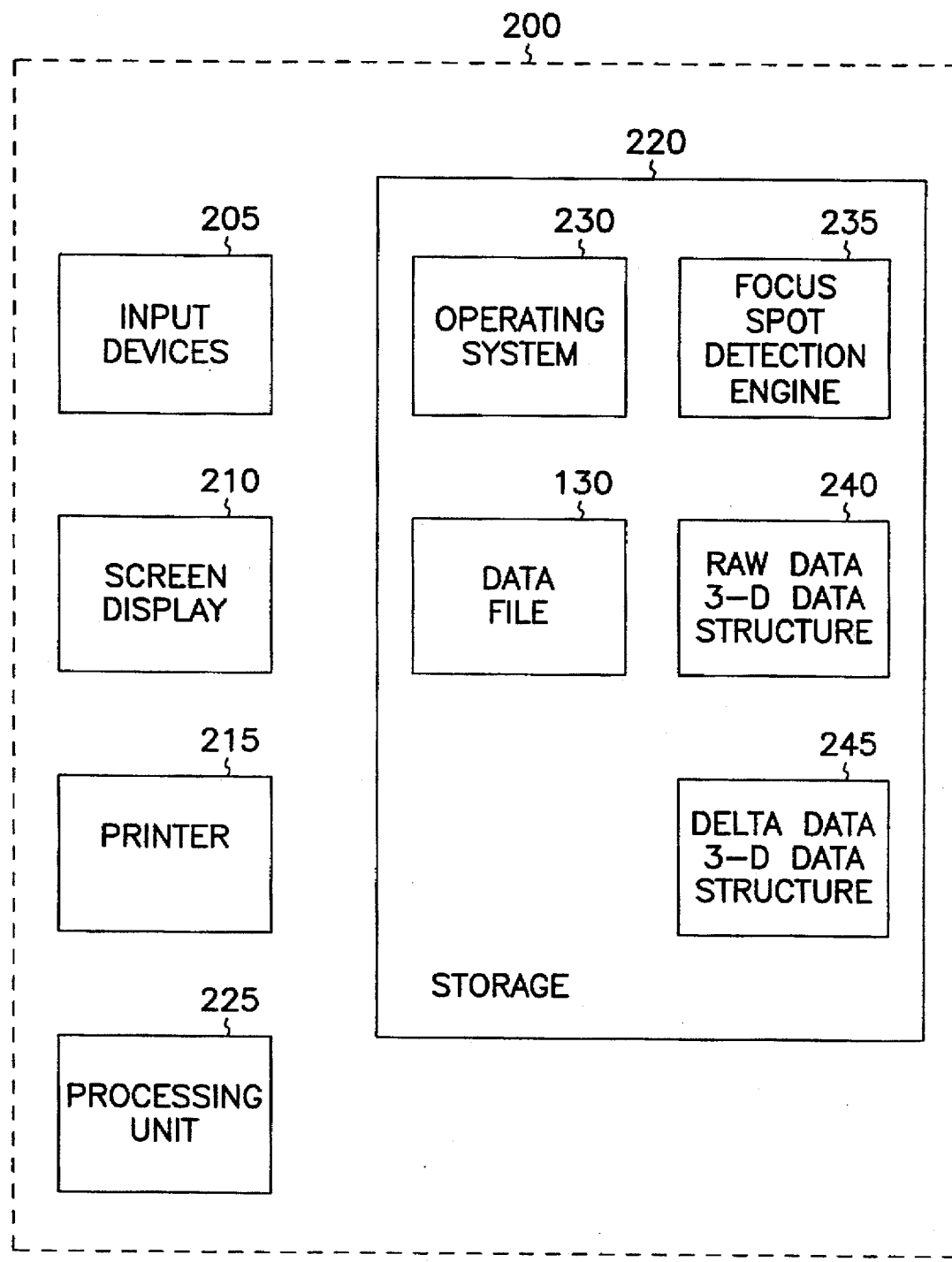
FIG. 2 is a block diagram of a computer system that tests for focus spots.

FIG. 2 is a block diagram of a computer system 200 that tests for focus spots after photolithographic system 100 processes wafers 110.1 through 110.n. Computer system 200 can be a separate processing unit from photolithographic system 100 or it can be integrated with photolithographic system 100. Computer system 200 includes input devices 205, screen display 210, printer 215, storage 220 and processing unit 225. Processing unit 225 can be a Sun workstation available from Sun Microsystems in Palo Alto, Calif. Storage 220 includes operating system 230, focus spot detection engine 235, raw data 3-D data structure 240, delta data 3-D data structure 245, as well as data file 130 created by stepper machine 105.

Focus spot detection engine 235 reads data file 130 containing data from physical control devices 125 as they processed wafers 110.1 through 110.n. Focus spot detection engine 235 constructs raw data 3-dimensional data structure from data extracted from data file 130. Delta data 3-dimensional data structure 245 is a second data structure created by focus spot detection engine 235 through smoothing of the data. Focus spot detection engine 235 analyzes resulting delta data 3-D data structure 245 for the presence of focus spots in wafers 110.1 through 110.n.

Figure 3:
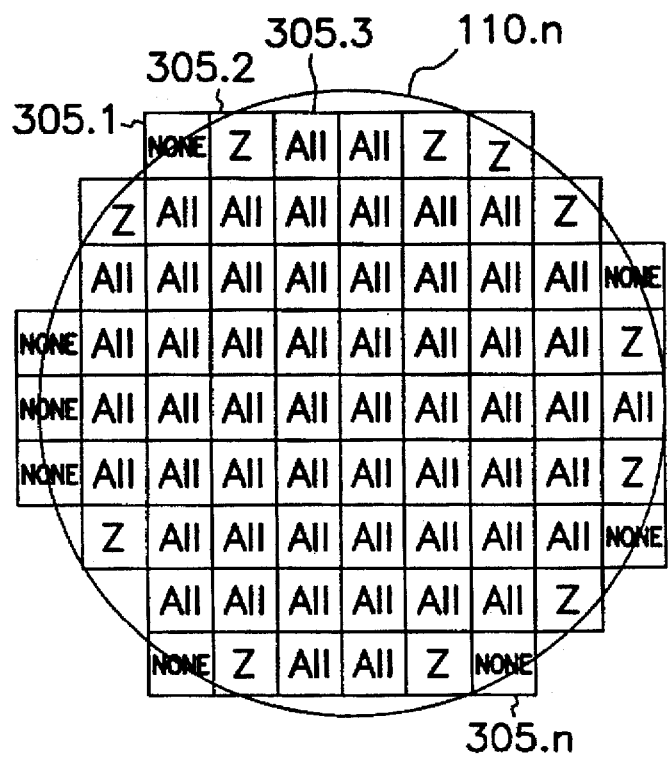
FIG. 3 is a diagram of one wafer from a wafer batch.

FIG. 3 is a diagram of one wafer 110.n from a wafer batch. A batch is made up of several wafers. Each wafer is made up of fields 305.1 through 305.n. Each field is the amount of wafer surface exposed at each step of the photolithographic process. As each field 305 is ready to be developed, physical control devices 125 set the wafer height (called Z) and tilt with respect to the x- and y-axes (called Rx and Ry, respectively) in order to bring field 305 into optimal focus.

This procedure of adjusting the wafer is, in one embodiment of stepper machine 105, accomplished by three leveling schemes. Simply, the "All-by-LS" scheme is used on fields, such as field 305.3, which are generally in the center of wafer 110.n. These are complete fields that do not fall off the edge of wafer 110.n. All-by-LS fields have unique Z, Rx, and Ry data values. The "Z-by-LS" scheme is used for fields at the wafer edge, such as field 305.2. Such fields generally have one side falling off the edge or fields with two edges falling off the wafer's edge that are adjacent to two All-by-LS fields. Z data is extracted from these Z-by-LS fields, but Rx and Ry data are not. The "None-by-LS" scheme is used generally on corner fields, such as field 305.1, where two sides fall off the edge of the wafer and that aren't adjacent to two All-by-LS fields. No unique Z, Rx, or Ry data is derived from None-by-LS fields.

Figure 4:
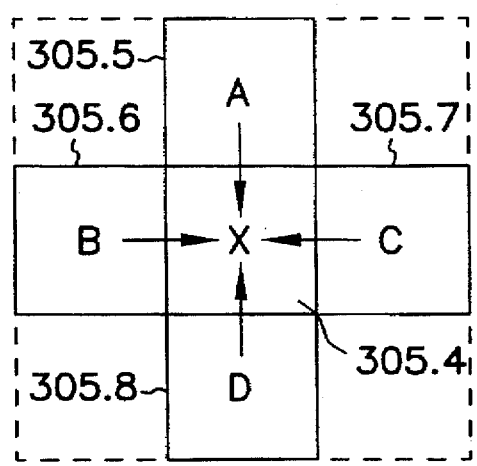
FIG. 4 is a graphical representation of how neighboring fields determine a delta value for a field.

Regardless of the scheme used, the Z, Rx and Ry data is part of the total data stored by processing unit 120 to data file 130 for each field 305 of each wafer 110 in a wafer batch. Focus spot detection engine 235 uses Rx and Ry data to determine whether a focus spot is present. Therefore, only All-by-LS fields, which have corresponding Rx and Ry data are analyzed. Rather than using the raw data stored in data file 130, focus spot detection engine 235 achieves better results by calculating a delta value for each field's Rx and Ry data. FIG. 4 is a graphical representation of how neighboring fields determine a delta value for field 305. FIG. 4 shows five fields 305.4 through 305.8. To determine the delta value X' for field X 305.4, values from field A 305.5, field B 305.6, field C 305.7 and field D 305.8 are used to find the arithmetic mean of the differences of the fields A, B, C and D from the field X. The formula for a delta value X' is thus:

$$X' = \frac{(|X - A| + |X - B| + |X - C| + |X - D|)}{4}$$

In this manner a delta Rx and a delta Ry is calculated for each raw Rx and raw Ry. This data smoothing is necessary to detect real focus spots while avoiding false ones. Having smoothed data allows focus spots to be more readily observed. The defining equation indicating a possible focus spot is given as:

$$threshold = \mu + x\sigma$$

where $\mu$ is the arithmetic mean and $\sigma$ is the standard deviation of all fields 305 in the wafer batch and x is some chosen constant multiplier. Because focus spots occur when Rx and Ry values spike, focus spots only occur when these values are above the mean. To reduce data variability, raw data values below the mean are adjusted to the value of $(\mu + \sigma)$ prior to being used to calculate the field deltas.

Figure 5:
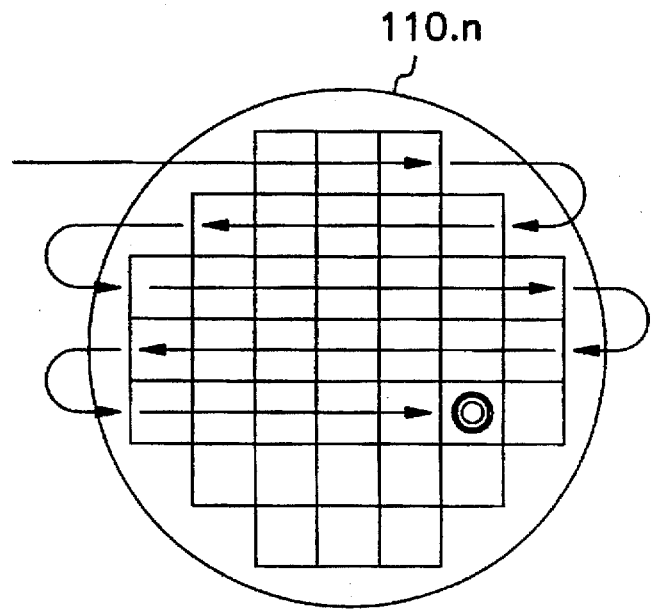
FIG. 5 is a diagram of a wafer, showing horizontal traversal.

Focus spot detection engine 235 inspects the field deltas from fields 305 in order to determine whether a focus spot is likely to have occurred. This determination is accomplished by a dual traversing algorithm. First, focus spot detection engine 235 inspects fields 305 horizontally. FIG. 5 is a diagram of a wafer, showing horizontal traversal. In FIG. 5, each field 305 is inspected sequentially. This is accomplished by the use of delta data 3-D data structure 245 which is constructed so that the sequential inspection shown in FIG. 5 is easily done. If any field during this horizontal traversal has a delta Rx or delta Ry surpassing the threshold limit (as defined by $(\mu + \sigma)$), then a possible focus spot has been detected. In order to lessen the chance of a false focus spot report, a second traversing algorithm is executed.

Figure 6:
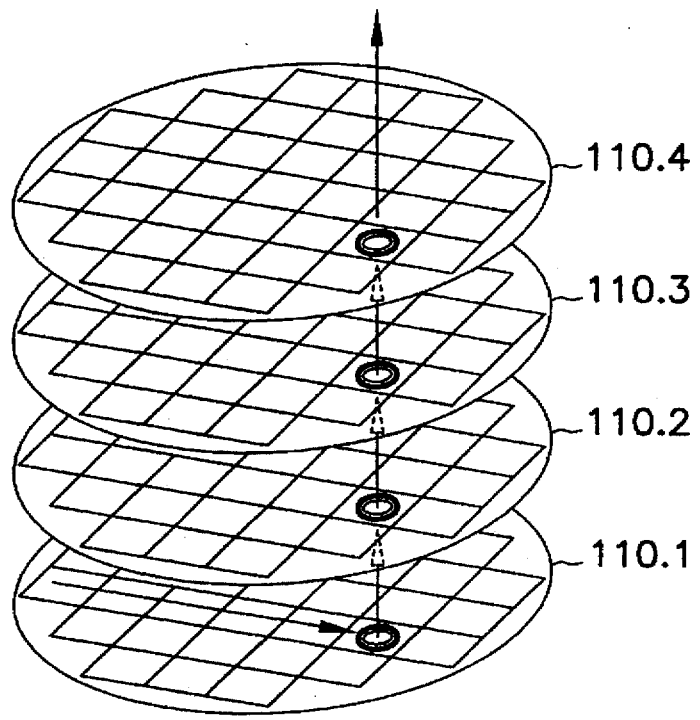
FIG. 6 is a diagram of a wafer batch, showing vertical traversal.

FIG. 6 is a diagram of a wafer batch, showing vertical traversal, the second traversing algorithm. As noted above, frequently a contaminant that causes a focus spot will remain on vacuum platform 115 during successive wafer 110 manufacturing. Therefore, a potential focus spot may be better validated if a possible focus spot is found in the same coordinate position of subsequent wafers. In FIG. 6, the corresponding fields on successive wafers 110.1 through 110.4 are checked. This is called vertical traversing and is assisted by the 3-dimensionality of delta data 3-D data structure 245. If enough possible focus spots are found in the same location on successive wafers during the vertical traversal, a focus spot is reported. However, since sometimes a focus spot does not appear in the same location on subsequent wafers, focus spot detection engine 235 also reports focus spots if a threshold of such singular observations is surpassed. Upon finding a focus spot with a wafer batch, focus spot detection system 200 will display a warning message on screen display 210.

Figure 7:
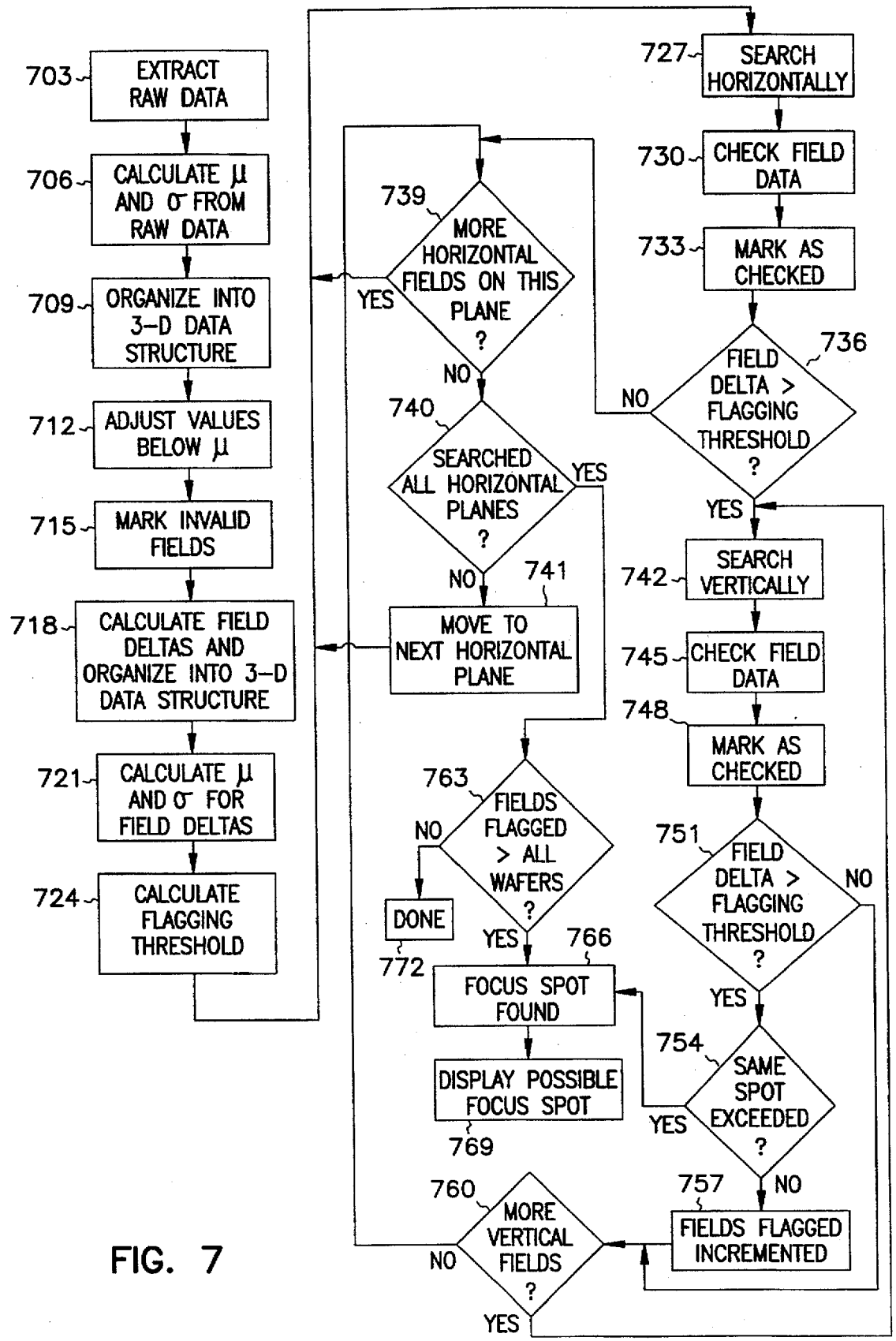
FIG. 7 is a flowchart of the method of detecting focus spots.

FIG. 7 is a flowchart of the method of detecting focus spots carried out by focus spot detection engine 235. In one embodiment, the flowchart of FIG. 7 is written as a C program. Other computer languages could be used to implement the flowchart as well. In FIG. 7, at step 703, the raw data is extracted from data file 130. This raw data includes Rx, Ry, Z-height, leveling scheme, and coordinate position for each field 305 of each wafer 110 in the wafer batch. At step 706, the arithmetic mean ($\mu$) and standard deviation ($\sigma$) are calculated for both Rx and Ry. Then the raw data is organized into a 3-dimensional data structure at step 709. The data structure links neighboring fields 305 and corresponding fields in the previous and next wafers 110. Because focus spots occur when Rx and Ry values spike, to smooth the data all Rx and Ry values in raw data 3-D data structure 240 which are below $\mu$ are replaced with $(\mu + \sigma)$ at step 712.

After the low values are replaced, step 715 marks certain fields as invalid for consideration. Such fields which are marked may be those by which Z-by-LS and None-by-LS schemes were used to obtain data from physical control devices 125 since these two schemes do not generate unique Rx and Ry values. In other embodiments, and as manufacturing techniques are improved, fewer or no fields may be marked as invalid. The next step, step 718, is to create a second data structure. The delta data 3-D data structure 245 is filled with field delta values (X') as explained previously. Then at step 721, the arithmetic mean ($\mu$) and standard deviation ($\sigma$) are calculated for the field delta.

Now that delta data 3-D data structure 245 exists, at step 724, the flagging threshold ($\mu + x\sigma$) is determined. The SIGMALEVEL parameter is the constant multiplier (x) to use in the flagging threshold equation. This is set by the user. Often, it will be between two and eight. The SIGMALEVEL is set with the issues of increased accuracy and mitigating false flags in mind. A lower SIGMALEVEL will cause more focus spots to be reported. However, more of these reports will be false flags than if a higher SIGMALEVEL is used.

With all data calculated, the traversals to seek a focus spot begin. Primarily, wafers 110.1 through 110.n are checked by a horizontal traversal, starting at step 727. The horizontal traversal checks each field 305.1 through 305.n on each wafer 110.1 through 110.n sequentially. As field 305 is checked in step 730, it is marked in step 733 so that field 305 will only be checked once. If field 305's field delta is greater than the flagging threshold then a vertical search is commenced at step 742.

A vertical traversal checks the field data for corresponding fields at the same coordinate position in subsequent wafers 110. Similar to the horizontal traversal, at step 745 the field data is checked and at step 748 the field is marked so that it will only be checked once. If the field delta value is greater than the flagging threshold, at step 754 the number of times that the fields in the coordinate position have exceeded the threshold are compared against the SAMESPOT parameter. Once SAMESPOT is exceeded, the system should report at step 766 that a focus spot was found. If the SAMESPOT parameter is not exceeded, a fields_flagged counter is incremented at step 757. This counter will cause a focus spot to be reported, at step 763, if the counter is greater than the ALLWAFERS parameter.

The SAMESPOT parameter will usually be a small value, perhaps five. This indicates that a potential focus spot located on the same field in five subsequent wafers 110 will cause the system to report a focus spot. The ALLWAFERS parameter will usually be larger than SAMESPOT, perhaps 15. This parameter indicates that when 15 potential focus spots are found by the system, a focus spot will be reported, even without corresponding focus spots on subsequent wafers.

Other embodiments of the present invention are possible without departing from the scope and spirit of the present invention. Other embodiments of this invention include a configuration allowing the currently invalidated fields on the edge of the wafers to be included in the focus spot detection method.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

We claim:

1. A computer-implemented method for detecting focus spots, comprising the steps of:

providing a computer having a processing unit, input device and storage, wherein the storage includes an all-wafers accumulator for tracking how many of a plurality of fields in a plurality of substrates are potential focus spots, and wherein the storage also includes a same-spot accumulator for tracking how many fields among corresponding coordinate fields are potential focus spots;

receiving a first plurality of data for the plurality of fields in the plurality of substrates processed in a photolithography system;

setting an all-wafers trigger, wherein the all-wafers trigger indicates how many potential focus spots must be identified throughout the plurality of substrates before flagging a detected focus spot;

setting a same-spot trigger indicating how many potential focus spots must be identified among corresponding coordinate fields of the plurality of substrates before flagging a detected focus spot;

calculating a second plurality of data as a function of the first plurality of data;

calculating a focus spot threshold as a function of the data from the second plurality of data to indicate the presence of a potential focus spot;

horizontally traversing the second plurality of data among consecutive fields on each of the plurality of substrates, wherein the step of horizontally traversing comprises the steps of:

incrementing the all-wafers accumulator if data in the second plurality of data surpasses the focus spot threshold;

reporting the detection of a focus spot if the all-wafers accumulator surpasses the all-wafers trigger;

vertically traversing the second plurality of data among corresponding fields on the subsequent substrates when data in the second plurality of data surpasses the focus spot threshold during the horizontal traversal step, wherein the step of vertically traversing comprises the steps of:

incrementing the same-spot accumulator when data in the second plurality of data surpasses the focus spot threshold; and reporting the detection of a focus spot when the same-spot accumulator surpasses the same-spot trigger.

2. The method for detecting focus spots as recited in claim 1, further comprising the step of invalidating the first plurality of data for removing a plurality of fields from focus spot detection.

3. The method for detecting focus spots as recited in claim 1, further comprising the step of adjusting the lower bounds of the first plurality of data to make the detection of focus spots more reliable, the step of adjusting comprising the steps of:

calculating an arithmetic mean ($\mu$) for the first plurality of data;

calculating a standard deviation ($\sigma$) for the first plurality of data; and replacing each of the data in the first plurality of data having a value less than the arithmetic mean with the sum of the arithmetic mean and the standard deviation ($\mu+\sigma$).

4. The method for detecting focus spots as recited in claim 1, wherein the step of calculating a second plurality of data comprises the step of calculating a delta value for each of the first plurality of data, and wherein the delta value for any data of the first plurality of data for a field surrounded by neighboring fields of similar data is the arithmetic mean of the differences between the field and the neighboring fields.

5. The method for detecting focus spots as recited in claim 1, wherein the step of receiving includes the step of organizing the first plurality of data by linking the data for a field to data for neighboring fields as well as to corresponding fields on previous and subsequent substrates.

6. The method for detecting focus spots as recited in claim 1, wherein the step of calculating the focus spot threshold comprises the step of calculating a multiple of a standard deviation above an arithmetic mean.

7. A focus spot detector, comprising:

a computer having a processing unit, input device and storage;

a data receiver for obtaining a first plurality of data for a plurality of fields in a plurality of substrates processed in a photolithography system;

an all-wafers trigger, which indicates how many potential focus spots must be identified before flagging a detected focus spot on one of the plurality of substrates;

a same-spot trigger which indicates how many potential focus spots must be identified among corresponding coordinate fields of the plurality of substrates before flagging a detected focus spot;

an all-wafers accumulator in the storage for tracking how many fields are potential focus spots;

a same-spot accumulator in the storage for tracking how many fields among corresponding coordinate fields of the plurality of substrates are potential focus spots:

a calculator for computing a second plurality of data as a function of the data from the first plurality of data;

a focus spot indicator, wherein the focus spot indicator is set as a function of the data from the second plurality of data indicating potential focus spots;

a horizontal traversal engine for checking the second plurality of data among consecutive fields on each of the plurality of substrates, wherein the horizontal traversal engine performs the steps of:
  incrementing the all-wafers accumulator if data in the second plurality of data surpasses the focus spot indicator; and
  reporting the detection of a focus spot if the all-wafers accumulator surpasses the all-wafers trigger;

a vertical traversal engine for checking the second plurality of data among corresponding fields on the subsequent substrates when data in the second plurality of data surpasses the focus spot indicator during the execution of the horizontal traversal engine, wherein the vertical traversal engine performs the steps of:
  incrementing the same-spot accumulator when data in the second plurality of data surpasses the focus spot indicator; and
  reporting the detection of a focus spot when the same-spot accumulator surpasses the same-spot trigger.

8. The focus spot detector as recited in claim 7, further comprising an invalidator that removes the first plurality of data from focus spot detection.

9. The focus spot detector as recited in claim 7, further comprising an adjustor for elevating the lower bounds of the first plurality of data to make the detection of focus spots more reliable, the adjustor performing the steps of:
  calculating an arithmetic mean ($\mu$) for the first plurality of data;
  calculating a standard deviation ($\sigma$) for the first plurality of data; and
  replacing each of the data in the first plurality of data having a value less than the arithmetic mean with the standard deviation above the arithmetic mean ($\mu+\sigma$).

10. The focus spot detector as recited in claim 7, further wherein the calculator for computing the second plurality of data computes a delta value for each of the first plurality of data, wherein the delta value for any data of the first plurality of data for a field surrounded by neighboring fields of similar data is the arithmetic mean of the differences between the field and the neighboring fields.

11. The focus spot detector as recited in claim 7, further comprising an organizer for organizing the first plurality of data by linking data for a field to data for neighboring fields as well as to corresponding fields on previous and subsequent substrates.

12. The focus spot detector as recited in claim 7, wherein the focus spot indicator is a multiple of the standard deviation above the arithmetic mean.

13. A computer program product, comprising:
  a computer usable medium having computer readable program code embodied thereon, the computer readable program code, when executed, implementing on the computer a method for detecting focus spots, the method comprising the steps of:
  providing a computer having a processing unit, input device and storage, wherein the storage includes an all-wafers accumulator for tracking how many of a plurality of fields in a plurality of substrates are potential focus spots and a same-spot accumulator for tracking how many fields among corresponding coordinate fields of the plurality of substrates are potential focus spots;
  receiving a first plurality of data for the plurality of fields in the plurality of substrates processed in a photolithography system;
  setting an all-wafers trigger, wherein the all-wafers trigger indicates how many potential focus spots must be identified throughout the plurality of substrates before flagging a detected focus spot;
  setting a same-spot trigger indicating how many potential focus spots must be identified among corresponding coordinate fields of the plurality of substrates before flagging a detected focus spot;
  calculating a second plurality of data as a function of the first plurality of data;
  calculating a focus spot threshold as a function of the data from the second plurality of data to indicate the presence of a potential focus spot;
  horizontally traversing the second plurality of data among consecutive fields on each of the plurality of substrates, wherein the step of horizontally traversing comprises the steps of:
    incrementing the all-wafers accumulator if data in the second plurality of data surpasses the focus spot threshold; and
    reporting the detection of a focus spot if the all-wafers accumulator surpasses the all-wafers trigger; and
  vertically traversing the second plurality of data among corresponding fields on the subsequent substrates when data in the second plurality of data surpasses the focus spot threshold during the horizontal traversal step, wherein the step of vertically traversing comprises the steps of:
    incrementing the same-spot accumulator when data in the second plurality of data surpasses the focus spot threshold; and
    reporting the detection of a focus spot when the same-spot accumulator surpasses the same-spot trigger.

14. The computer program product as recited in claim 13, the method further comprising the step of invalidating the first plurality of data in order to remove a plurality of fields from focus spot detection.

15. The computer program product as recited in claim 13, wherein the step of calculating a second plurality of data comprises the step of calculating a delta value for each of the data of the first plurality of data; wherein the delta value for any data of the first plurality of data for a field surrounded by neighboring fields of similar data is the arithmetic mean of the differences between the field and the neighboring fields.

16. A method for detecting focus spots, comprising the steps of:
  processing a plurality of substrates with a photolithographic stepper for preparing a plurality of fields for each of the plurality of substrates;

providing an all-wafers accumulator for tracking how many fields among the plurality of substrates are potential focus spots;

providing a same-spot accumulator for tracking how many fields among corresponding coordinate fields of the plurality of substrates are potential focus spots setting an all-wafers trigger, which indicates how many potential focus spots must be identified before flagging a detected focus spot;

setting a same-spot trigger, which indicates how many potential focus spots must be identified among corresponding coordinate fields of the plurality of substrates before flagging a detected focus spot;

measuring a tilt with respect to the x-axis, a tilt with respect to the y-axis, and a substrate height for producing therefrom a plurality of measurement data for each of the plurality of fields;

calculating an arithmetic mean and a standard deviation for the plurality of measurement data;

setting a focus spot threshold based on the arithmetic mean and the standard deviation, wherein measurement data exceeding the focus spot threshold's value are potential focus spots;

horizontally traversing the plurality of measurement data for consecutive fields on the plurality of substrates, the step of horizontally traversing comprising the steps of:
incrementing the all-wafers accumulator when the data from the plurality of measurement data surpasses the focus-spot threshold; and
reporting the detection of a focus spot if the all-wafers accumulator surpasses the all-wafers trigger.

vertically traversing the plurality of measurement data for corresponding fields on the subsequent substrates when measurement data for a field surpasses the focus spot threshold during the horizontal traversal step, wherein the step of vertically traversing comprises the steps of:
incrementing the same-spot accumulator when measurement data surpasses the focus spot threshold; and
reporting the detection of a focus spot when the same-spot accumulator surpasses the same-spot trigger.

17. The method for detecting focus spots, as recited in claim 16, the method further comprising the step of calculating a delta value for each of the plurality of measurement data; wherein the delta value for data in the plurality of measurement data for a field surrounded by neighboring fields of similar data is the arithmetic mean of the differences between the field and the neighboring fields.

18. The method for detecting focus spots, as recited in claim 16, further comprising the steps of:

calculating an arithmetic mean and a standard deviation for the plurality of measurement data;

adjusting the lower bounds of the plurality of measurement data by replacing the plurality of measurement data evaluating to less than the arithmetic mean with the sum of the arithmetic mean and the standard deviation.

* * * * *